United States Patent [19]

Smith

[11] Patent Number: 4,859,806

[45] Date of Patent: Aug. 22, 1989

[54] DISCRETIONARY INTERCONNECT

[75] Inventor: Robert T. Smith, Round Rock, Tex.

[73] Assignee: Microelectronics and Computer Technology Corporation, Austin, Tex.

[21] Appl. No.: 194,666

[22] Filed: May 17, 1988

[51] Int. Cl.[4] ............................................... H05K 1/00
[52] U.S. Cl. ..................................... 174/68.5; 29/847; 361/416; 439/46; 439/47; 439/75; 439/511
[58] Field of Search ............... 174/68.5; 361/410, 416; 439/46, 47, 48, 74, 75, 511, 507; 29/847

[56] References Cited

U.S. PATENT DOCUMENTS

| | | | |
|---|---|---|---|
| 2,019,625 | 11/1935 | O'Brien | 174/68.5 X |
| 2,914,706 | 11/1959 | Hill et al. | 361/410 |
| 3,128,332 | 4/1964 | Burkig et al. | 174/68.5 |
| 3,137,534 | 6/1964 | Schafer et al. | 174/68.5 |
| 3,142,112 | 7/1964 | Burkig et al. | 29/847 |
| 3,148,438 | 9/1964 | Winter et al. | 29/847 |
| 3,177,405 | 4/1965 | Gray | 174/68.5 |
| 3,189,978 | 6/1965 | Stetson | 174/68.5 |
| 3,312,871 | 4/1967 | Seki et al. | 361/410 X |
| 3,478,425 | 11/1969 | Cooke | 29/868 |
| 3,485,934 | 12/1969 | Prather | 174/68.5 |
| 3,535,780 | 10/1970 | Berger | 29/837 |
| 3,564,115 | 2/1971 | Gribble | 174/68.5 |
| 3,573,708 | 4/1971 | Yarrick et al. | 439/48 X |
| 3,621,116 | 11/1971 | Adams | 174/68.5 |
| 3,702,025 | 11/1972 | Archer | 29/407 X |
| 3,711,627 | 1/1973 | Maringulov | 174/68.5 |
| 3,718,936 | 2/1973 | Rice, Jr. | 361/410 X |
| 3,824,433 | 7/1974 | Newton, Jr. | 361/416 |
| 3,838,317 | 9/1974 | Coyne | 174/68.5 X |
| 4,064,357 | 12/1977 | Dixon et al. | 174/68.5 |
| 4,254,445 | 3/1981 | Ho | 361/392 |
| 4,434,321 | 2/1984 | Betts | 174/68.5 |
| 4,458,297 | 7/1984 | Stopper et al. | 361/403 |
| 4,467,400 | 8/1984 | Stopper | 361/403 |
| 4,486,705 | 12/1984 | Stopper | 324/73 |
| 4,521,262 | 6/1985 | Pellegrino | 156/150 |
| 4,524,239 | 6/1985 | Rouge | 174/68.5 |
| 4,560,962 | 12/1985 | Barrow | 333/1 |
| 4,636,919 | 1/1987 | Itakura et al. | 361/414 |
| 4,679,321 | 7/1987 | Plonski | 174/68.5 X |
| 4,743,710 | 5/1988 | Shieber et al. | 174/68.5 |
| 4,764,644 | 8/1988 | Reisman et al. | 174/68.5 |

FOREIGN PATENT DOCUMENTS

| | | | |
|---|---|---|---|
| 2234033 | 1/1974 | Fed. Rep. of Germany | 439/48 |
| 1233844 | 6/1971 | United Kingdom | 439/511 |

OTHER PUBLICATIONS

Anderson, P. C. et al; Josephson Package Repair; IBM Technical Disclosure Bulletin; vol. 26, No. 12; May 84; pg. 6244.

Flexmark Brochure (N date).

Primary Examiner—Morris H. Nimmo
Attorney, Agent, or Firm—Fulbright & Jaworski

[57] ABSTRACT

A discretionary interconnect which includes orthogonal arrays of conductors sandwiched between conductive planes and accessible through a number of selectively arranged vias for interconnection and interruption. Also disclosed is a process of personalizing an interconnect of this type by selectively connecting and disconnecting the conductors.

12 Claims, 8 Drawing Sheets

CUTTING PUNCH,
LASER BEAM,
CHEMICAL CUTTING

DISCRETIONARY INTERCONNECT

BACKGROUND OF THE INVENTION

The present invention relates to a discretionary interconnect and, specifically, to an interconnect which can be programmed or wired through the selective connection and disconnection of the underlying transmission wires at vias selectively placed about the interconnect.

Interconnects, as building blocks for electronic circuitry and microcircuitry, typically receive and support further electrical devices, for example, substrates, i.e., smaller scale interconnects, integrated circuit chips, capacitors, resistors, and so forth, which can be electrically connected to one another to produce larger, more complex electrical structures. The interconnects typically have a sandwich-type structure through which a series of wires extend. The wires connect the electrical devices attached to the interconnect according to a plan specified by the interconnect user.

The interconnects are used in a multiplicity of designs, each requiring unique electrical circuitry. Presently, in a majority of the interconnects, the wiring plan is fixed at an early stage of manufacture. In other words, the manufacturer lays down the interconnect wiring according to a specific, predetermined plan. Such interconnects will be referred to as "design specific". As is readily apparent, design specific interconnects cannot be mass produced, except for high volume applications and are, therefore, time and cost intensive.

There is a need in the interconnect industry for an interconnect design which can be mass produced in an unspecified manner and, thereafter, programmed to produce whatever wiring plan is required by the user. Such interconnects will be referred to as "discretionary interconnects" and the final step of imposing the wiring plan on the interconnect will be referred to as "customization."

Recent efforts in this area have yielded interconnect structures having orthogonal, nonplanar arrays of transmission lines. The lines are generally in the shape of a grid with x-direction lines in one plane and y-direction lines in another plane. These lines are then joined to form the interconnect network. Reference is made to U.S. application Ser. No. 102,172, filed Sept. 29, 1987, to David H. Carey, and Ser. No. 158,172, filed Feb. 19, 1988, to Lawrence N. Smith, for descriptions of discretionary interconnects of this type.

A particular problem incurred by this type of design is the control of characteristic impedance. As a solution to this problem, conductive or ground planes are placed on either side of the x-y wiring structure to achieve a controlled impedance. However, because of the fact that the interconnect must be subsequently accessed to customize the interconnect, i.e., program the wiring network, the ground planes cannot be continuous. As the access area increases, the ability of the ground planes to control impedance diminishes.

U.S. Pat. No. 4,560,962 discloses an interconnect structure which is designed to control impedance; however, the structure is very burdensome. The design is not discretionary, but instead, the via, or points of wiring modification as will be described below, must be custom fabricated to suit each application. The design, therefore, offers limited capability to program the structure to the particular application.

In contrast, U.S. Pat. No. 2,019,625 discloses a discretionary apparatus having a grid of wires buried in a support structure with access points at select areas of wire overlap. However, this apparatus does not have ground planes and is not concerned with controlled impedance. The disclosure relates to the assembly of radio sets (pre-WW II) with a universal wiring pattern. The structure is adequate for that purpose where low to moderate signal frequencies (less than 10 MHz) are involved. In this case, the signal rise time (longer than 30 nanoseconds) is significantly longer than the transit time through the circuit (if 1 foot dimensions prevail, the signal will transit in about 2-3 nanoseconds) and therefore impedance controlled circuitry, such as would be provided by ground planes and microstrip, is not required.

Accordingly, there exists a need for a discretionary interconnect which provides sufficient means for customizing the wiring network, while providing adequate impedance control.

SUMMARY OF THE INVENTION

It is, therefore, an object of the present invention to provide a discretionary interconnect.

Another object of the present invention is to provide a discretionary interconnect which is easy to customize during fabrication or at a later stage.

Yet another object of the present invention is to provide an improved method for customizing a discretionary interconnect.

Still another object of the invention is to provide a discretionary interconnect with advantageous controlled impedance.

Thus, in accordance with one aspect of the present invention, there is provided a discretionary interconnect which includes a first set of essentially parallel, coplanar electrically conductive wires, a second set of essentially parallel, coplanar electrically conductive wires which are orthogonal to the first set of wires, first and second conductive planes positioned on either side of the wires, a first set of vias accessing the first set of wires, and a second set of vias accessing the second set of wires. The vias are preferably in a face-centered configuration.

In one embodiment, a third set of vias are provided. These vias are positioned at the areas of x-y wire overlap.

Also provided by the present interconnect is a means for joining the various wires. The joining means can be in many forms. For example, a wire trace can be used having a conductive material on one side. The trace extends between two wires to be joined, with an insulating layer positioned between the trace and the adjacent ground plane. In another embodiment, the joining means can be in the form of an insulated wire with uninsulated end segments. The trace or insulated wire can be joined to the underlying wiring structure by soldering, gluing, mechanical connectors and other means.

In accordance with another aspect of the present invention, there is provided a process for customizing an interconnect comprising the steps of producing an interconnect of the type above, selectively removing sections of the wires at the vias, and selectively interconnecting the wires at the vias. The removal step can be performed mechanically, chemically or electrochemically.

The present invention provides an easy-to-program interconnect which provides advantageous impedance control.

Further objects, features and advantages of the present invention will be apparent from a review of the detailed description of preferred embodiments which follows, when considered together with the drawings, a brief description of which follows.

DETAILED DESCRIPTION OF PREFERRED EMBODIMENTS

Figure 1:
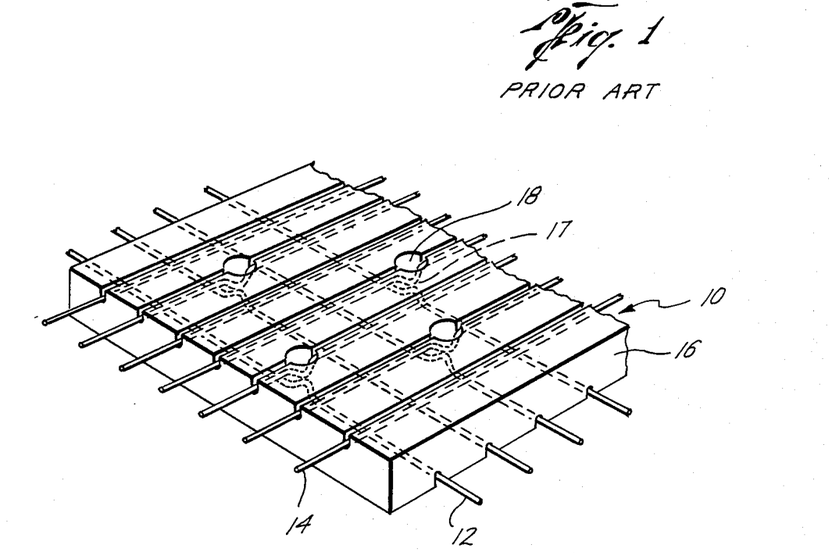
FIG. 1 is an isometric view of a prior art electrical apparatus.

FIG. 1 illustrates an early design of an electrical apparatus 10. The wiring is shown in the form of a series of x- and y-wires 12 and 14, respectively. The x-wires are positioned in the substrate 16 in a plane below the y-wires. The wires are joined at select areas of overlap 17 by bumps formed in the wires. The x-wires are raised and the y-wires are lowered into contact with one another. The overlap areas 17 have an opening 18 which provides access to the wires to be joined.

The apparatus of FIG. 1 does not include ground planes and is not concerned with controlling impedance. This is because the invention addresses the need for assembly of radio sets by a universal wiring pattern scheme for detection of signals of low to moderate frequency. Signal frequencies are not addressed in this patent; the concern is with arrangement and connection of the various components of a circuit. In the era that the cited invention was conceived (1930's), the applications involved the processing of signals with frequencies equal to or less than about 10 MHz (AM radio through international short wave band). These frequencies require the circuit to conduct a signal with a risetime as short as 30 nanoseconds. If the rate of change of a signal (as characterized by its risetime) is such that the signal does not change appreciably in time as it progresses through the circuit, i.e., the propagation time through the circuit is significantly shorter than the rise time of the signal, a controlled impedance environment in the circuitry is not required. For example, if the dimensions of the "radio set" circuitry are of the order of one foot, the associated circuitry propagation times would be of the order of 2–3 nanoseconds, considerably shorter than the risetime of the signal being propagated. The cited patent is suitable for that application, but not for the application conceived by the present invention where sub-nanosecond rise times are the rule, but the overall dimensions of the circuit are still about the same (one foot). The present invention addresses the application regime where the signal risetime is now shorter than its propagation time.

Figure 2:
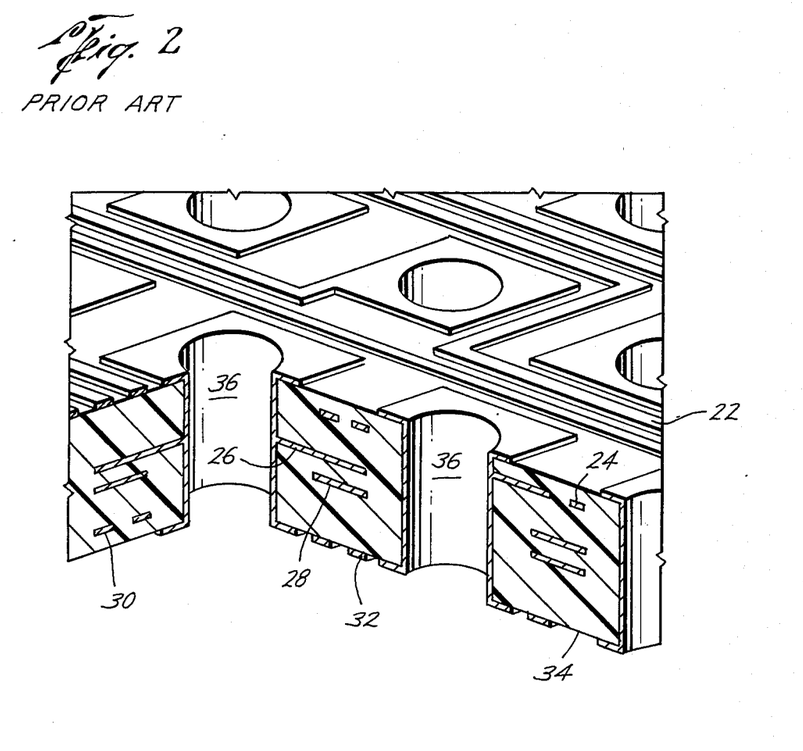
FIG. 2 is a cross-sectional isometric view of another prior art device.

FIG. 2 is a recently designed structure which provides vias through the substrate. More specifically, FIG. 2 describes the invention of a 100 ohm controlled impedance multilayer printed circuit board. The board consists of six planar layers of conductor, each separated by dielectric. Proceeding through the structure, the top or component side 20 contains upper external signal traces 22 followed by internal upper signal traces 24, ground plane 26, power plane 28, internal lower signal traces 30 and the lower external signal traces 32 which are located on the lower "solder" side 34. The regular array of plated-through holes or vias 36 is provided in order to make connection from any of the signal planes to the top layer, ground plane, or voltage plane as appropriate. The via connections are determined in the design of the board and accomplished in the fabrication process by a plating technique. The geometry of the signal trace width, thickness, and separation from the ground and power planes are so chosen to create a microstrip environment with the desired 100 ohm characteristic impedance. In order to achieve identical impedances, the signal trace dimensions must vary according to their placement within the structure due to the surrounding electric field environment.

The structure of FIG. 2 does not provide for discretionary alteration of the finished structure by the ultimate user for a particular application. The via connections must be accomplished during the fabrication of the circuit board. There is no provision for arbitrary circuit race interruption or arbitrary connection to another circuit race by the user as described by the present invention.

Figure 3:
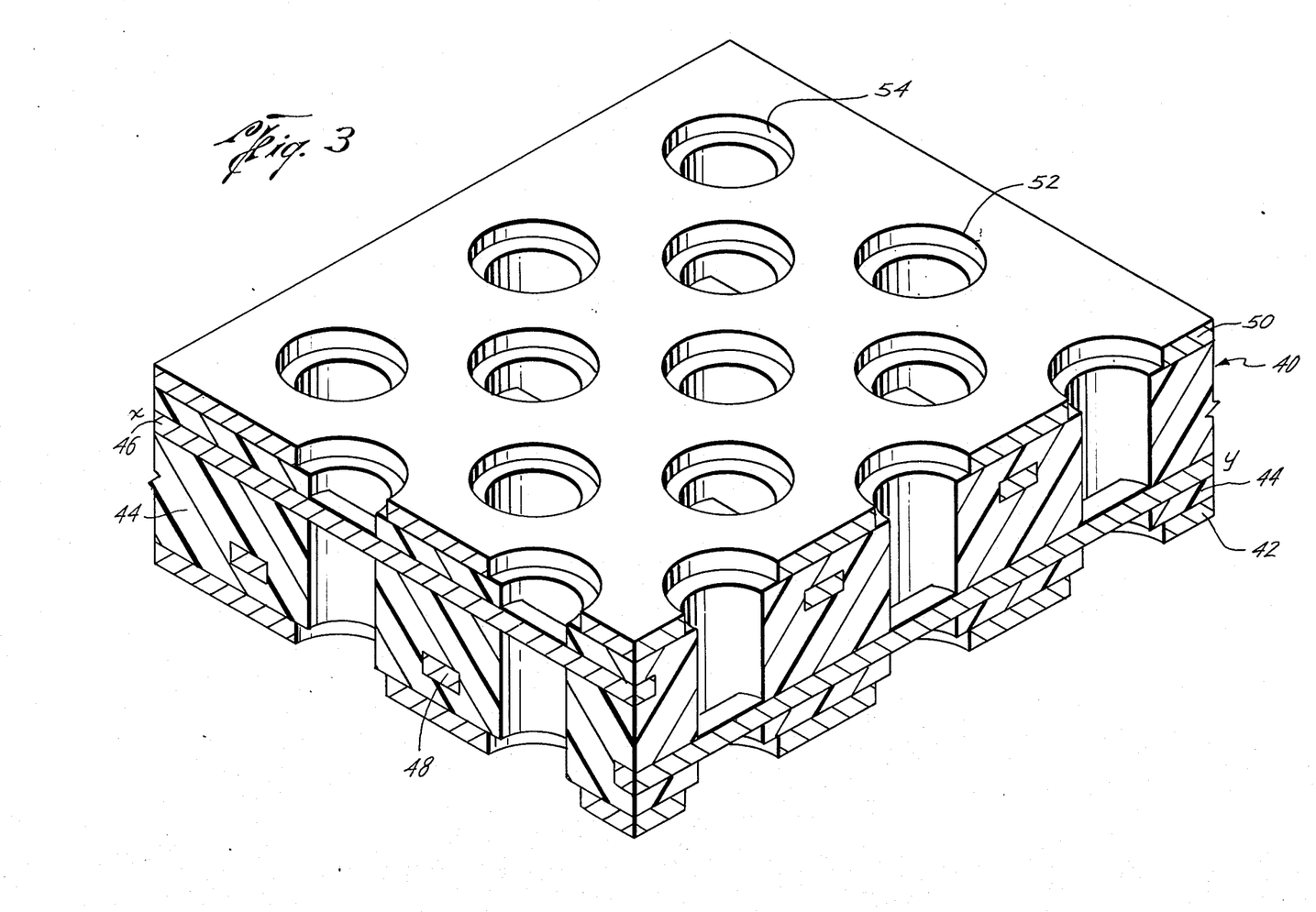
FIG. 3 is a cross-sectional isometric view of an interconnect according to the present invention.

An embodiment of the interconnect of the present invention is illustrated in FIG. 3. The interconnect 40 includes, from bottom to top, a first ground plane 42. Immediately above the ground plane is a dielectric material 44. Embedded within the dielectric is an orthogonal matrix of x- and y-transmission wires 46 and 48, respectively. These transmission wires, after they are interconnected, form the wiring structure which electrically connects the various electrical devices to be attached to the interconnect. A second ground plane 50 is placed on top of the interconnect structure.

As previously discussed, it is the goal of much present-day interconnect design to construct an interconnect which can be mass-produced in a non-customized manner and, subsequently, interconnected or "customized" to a user-specific need. The object is to move away from the construction of customized interconnects which require the laying down of wiring in a certain order and with certain specified connections. The present design lays down the wires in a grid. Once the interconnect is constructed, the end-user can specify the particular wiring scheme he or she needs and the wires are then connected or disconnected as necessary. The latter step is referred to as the customization step.

In order to perform the customization, the interconnect of FIG. 3 has a number of vias 52 which provide access to the wires. To connect wires, a wire trace or other structure to be described in more detail below is extended between the vias of the selected wires. To disconnect a wire, the wire is chemically, electrochemically or mechanically cut at the select via.

The via location is of particular importance in the present invention due to the need for controlled impedance. The presence of a via implies a disruption of the ground plane. This disruption will affect the constancy of the impedance value along a circuit trace as it passes in the vicinity of a via. A balance of requirements (dependent upon the application) must be maintained between accessibility, in the form of the number and size of vias, and the need for an ideal transmission line environment for the conducted signals.

The vias of the present interconnect are positioned in a geometrically controlled manner. Furthermore, the size of the vias are controlled so that they are large enough to be workable, yet small enough to avoid loss of control of the characteristic impedance. Because the via geometry is controlled, all of the conductors are equally spaced from like ground planes.

An additional perturbation of the constancy of impedance will occur at the internal cross-over points of the orthogonal circuit traces because of the interactions of the electromagnetic fields of the circuit traces. This interaction can be minimized by increasing the dielectric spacing (thickness) between the orthogonal arrays according to the quality of transmission required by the application. A factor of two or more in this separation between arrays compared to either array with its adjacent ground plane is appropriate.

In addition to the above noted factors for consideration in designing the present interconnect, the end-user has an additional option in controlling impedance by closing unused via openings by foil overlayment to maintain a more ideal microstrip environment for critical applications.

Finally, with reference again to FIG. 3, the vias according to this embodiment are shown to have a lip 54. As will become more apparent below, the lip or offset, decreases the likelihood that the naked wire of the connector extending from the via will contact the conductive ground plane 50.

Figure 4:
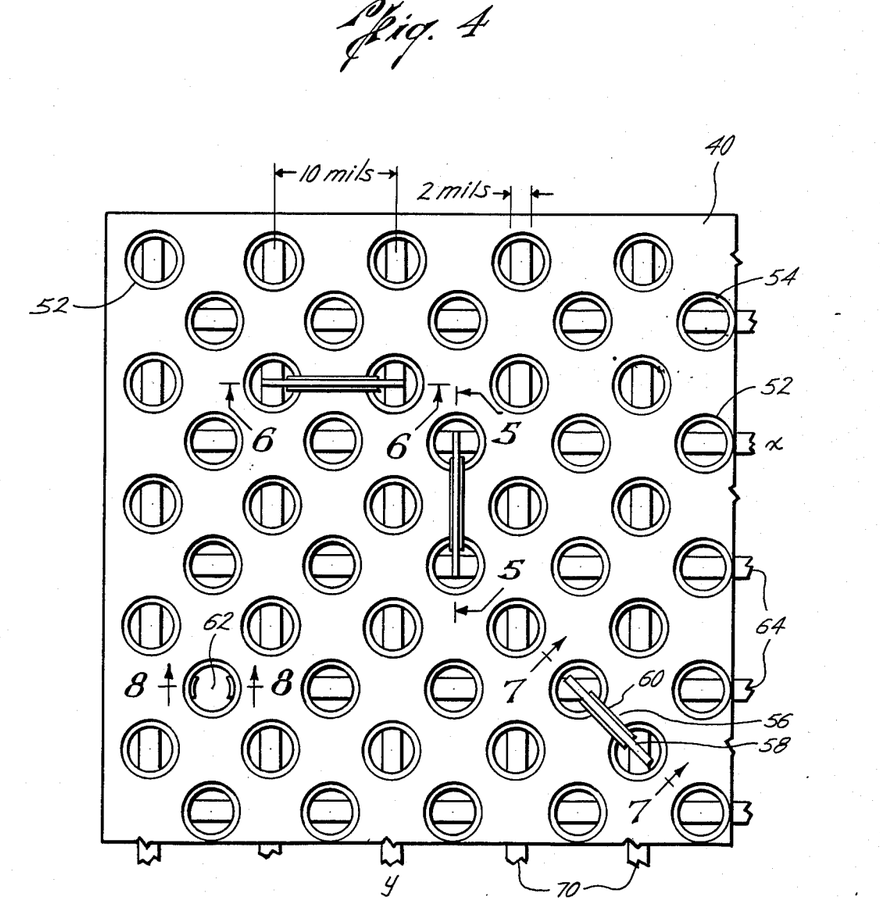
FIG. 4 is a plan view of the interconnect of the present invention.

FIG. 4 shows the interconnect 40 from above. The vias 52 are arranged in a face-centered configuration. The figure illustrates many of the structures discussed above. The lip 54 of the via is shown. Also, three wire traces 56 are shown. The traces 56 extend between wires to be connected. As shown, the connection can be between x-wires, between y-wires, or between an x- and a y-wire. The wire trace includes the wire lead itself 58 and an insulative material 60. The insulation 60 extends between the vias along the majority of the trace's length. The insulation is positioned between the ground plane and the trace to prevent shorting.

FIG. 4 also illustrates a cut or disconnected wire 62. As previously noted, the series of connections and disconnections results in the customization of the interconnect. The customization, both connection and disconnection, can be performed in any number of ways. FIGS. 5-7 and 10-13 show some examples.

Figures 5, 6, 7, 8:
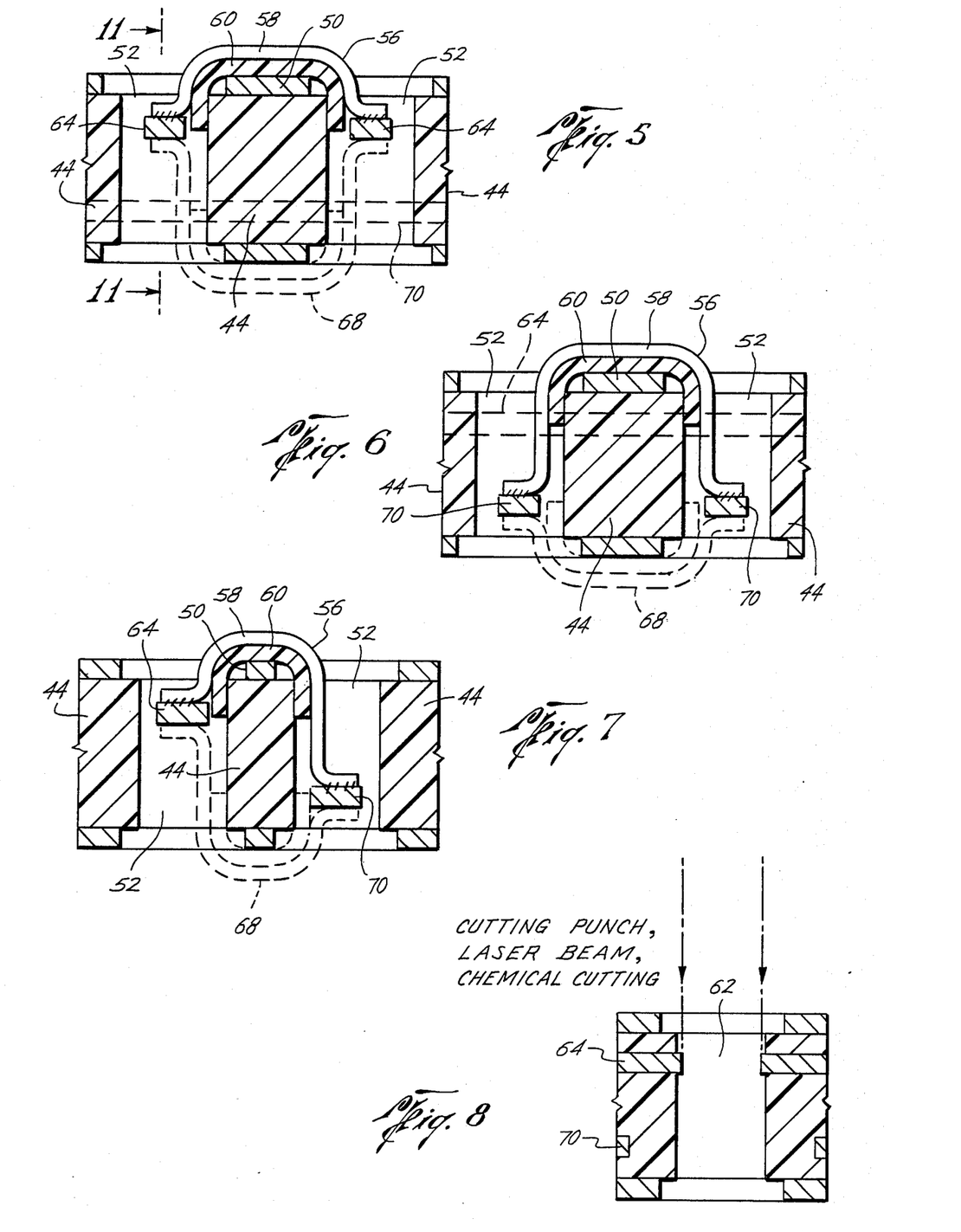
FIG. 5 is a cross-sectional view of an interconnect according to the present invention illustrating a x—x wire bond along lines 5—5 of FIG. 4.
FIG. 6 is a cross-sectional view of an interconnect according to the present invention illustrating an y—y wire bond along lines 6—6 of FIG. 4.
FIG. 7 is a cross-sectional view of an interconnect according to the present invention illustrating an x-y wire bond along lines 7—7 of FIG. 4.
FIG. 8 is a cross-sectional view of an interconnect according to the present invention illustrating the disconnection of an x-wire along lines 8—8 of FIG. 4.

FIGS. 5-7 illustrate one means for attaching wires of the interconnect, i.e., a wire trace. According to FIG. 5, the trace 56 extends between two x-wires 64 (see lines 5—5 of FIG. 4). The trace 56 is formed by the lead 58 and an insulation layer 60. As previously described, the insulation extends into the two vias 52 and isolates the lead 58 from the ground plane 50. Also illustrated in FIG. 5 is the dielectric 44. The y-wire 70 is shown in horizontal broken lines.

In another embodiment, the trace can be enclosed in insulation, except for its attachment ends. Such a design avoids any problems which may arise with the trace of FIG. 5 caused by incorrect alignment of the trace.

FIG. 5 also illustrates that the trace could extend from the other direction, i.e., down and over the lower ground plane, due to the symmetry of the interconnect geometry. The alternative trace is shown by broken lines 68.

FIG. 6 illustrates the attachment of y-wires 70 (see lines 6—6 of FIG. 4) in a manner identical to FIG. 5. Like structure is labelled with like reference numbers.

Like FIGS. 5 and 6, FIG. 7 depicts a wire trace for attaching the transmission wires of the non-committed interconnect. In FIG. 7, a connection is made between x-wire 64 and y-wire 70. The x-y connection is shown along lines 7—7 of FIG. 4.

Another method for performing the interconnection involves the use of an insulated wire, as previously mentioned. Analogous to wire-wrap techniques, the insulation is removed from the ends of the insulated wire jumper and the ends are inserted between via sidewall and substrate conductor and held by friction. Alternatively, a small amount of conductive epoxy or an amalgam can be used to enhance the contact.

Yet another method combines the use of the via sidewall and the conductive plane. The structures can be activated by selective laser radiation to form conductive paths in a subsequent post-processing step.

Additional approaches can be envisioned using sequential sputtering, evaporation, or other plating techniques using additive or subtractive processing to place layers of insulating and conducting materials.

The wire trace or insulated wire jumper can be formed from a variety of conductive materials having reasonable electrical conductivity. Suggested materials for the wire lead are copper, silver, gold and aluminum. Particularly preferred is copper. The insulation material can also be selected from a variety of materials. Examples of such materials are organic polymers, for example, polytetrafluoroethylene, polyethylene, polyimide and polyvinyl chloride. Also, ceramics and silicon are suggested non-flexible materials. Polyimide is a preferred choice.

The form of the insulated jumper could have the circular cross-section of an insulated wire or, alternatively, a rectangular metal trace supported on an insulating tape. Other cross-sections are envisioned, with the above simply being by way of example.

FIG. 8 illustrates the removal of a wire section of x-wire 64. The removal can be accomplished by a variety of means, mechanical, electrochemical and chemical, such as, mechanically cutting or punching, cutting with a laser beam or chemical treatment. The most straight-forward approach to this operation is mechanical. A punch, the operation of which can be under software control, can remove conductor at the x- or y-conductor access vias where interruption is needed. An analogous chemical approach can utilize a dispensing nozzle or pipet, positioned as in the punch example, which places a controlled amount of etchant on the conductors at the desired location. After the interruption is complete a neutralizer or water is dispensed in the same fashion to remove excess etchant and spent material.

A third technique uses a laser machining process. A personalized mask, exposing only the vias containing conductors to be interrupted, is used with a continuous raster scanned beam. A controlled rastered or vectored beam driven by software can be utilized to address the specific via locations.

Figures 9, 9A:
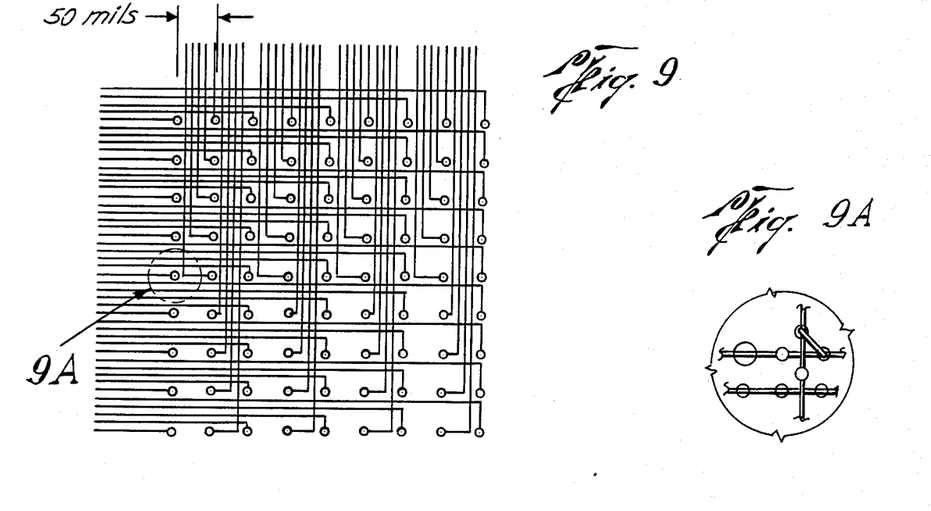
FIG. 9 is a schematic view of an x-y wire diagram.
FIG. 9A is an enlarged sectional view of the area 9A of the diagram of FIG. 9.

FIG. 9 summarizes the geometry or configuration of the x- and y-conductor interruptions and interconnections. The figure shows an illustration of connections to all I/O of an 18*18 (324 pad) 50 mil center area array package. FIG. 9A schematically shows a wire trace interconnection between an x-and y-wire. In order to avoid complexity in the schematic, FIG. 9 shows every fifth via since these are the points for external connections.

Figure 10:
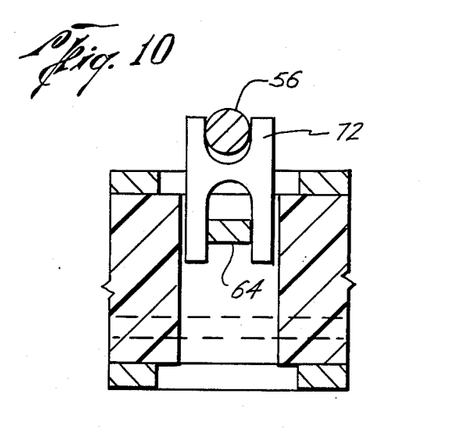
FIGS. 10–13 are cross-sectional views illustrating means for joining wires according to the present invention.

The wire trace can be physically attached to the transmission wire, or conductor, by a variety of methods. FIG. 10 shows the use of a mechanical connector. The connector 72 is in an H or double-U configuration. The top-U receives the end of the wire trace 56 or insulated wire jumper. The lower-U engages and receives the transmission line 64. The U-shaped areas should be dimensioned to provide interference fits with the trace and conductor.

The connector 72 can be formed from a variety of materials, particularly, springy material with a large elastic behavior region. Alloys such as phosphor-bronze and beryllium-copper are suggested. Alternatively, shape memory alloys can be used. These materials change dimension on traversing a temperature transition and return to a predetermined shape.

Figure 11:
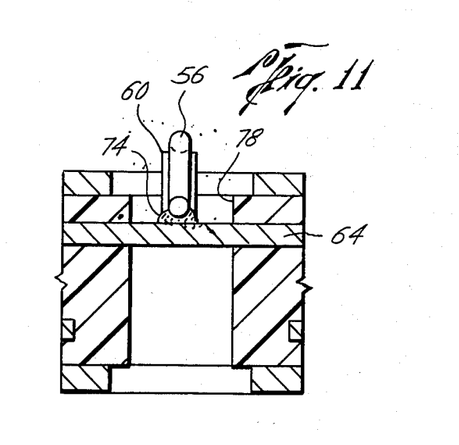

FIG. 11 illustrates a solder connection 74 between trace 56 and wire 64. The connection of FIG. 5 can also be a solder connection. In place of solder, a conductive epoxy can be used to make the conductive connection between trace and conductor. In these cases, the via sidewalls 78 serve as dams to control placement of the epoxy or solder.

A variety of epoxies and solders can be used. Suggested epoxies include thermally activated and silver loaded room temperature setting materials. Suggested solders (selected with the temperature stability of the substrate materials in mind) include various lead-tin and indium based materials, as well as other metal alloy systems such as amalgams. Particularly preferred are conductive epoxies and low temperature solders commonly employed by the hybrid circuits industry.

Figure 12:
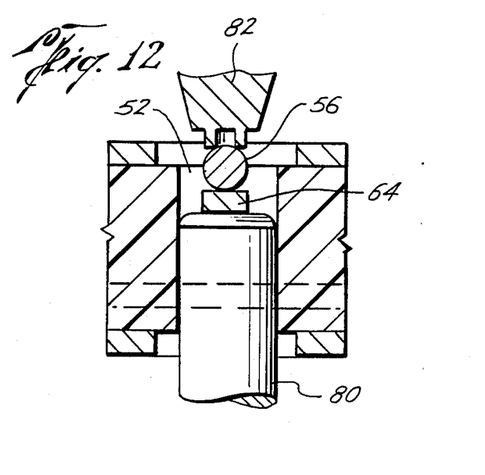

FIG. 12 shows yet another means for attaching the trace 56 to wire 74. This is referred to as single point bonding. A stationary anvil 80 projects into the selected via 52 from the backside of the substrate and supports the conductor 74 to be interconnected. The thermode or ultrasonic-coupled bond tool 82 (depending on whether thermocompression or thermosonic methods are used) position the connector, e.g., wire trace or insulated bonding wire, through the via on the front side of the interconnect to effect a bond. The same procedure is used on the opposing end of the interconnect wire.

Figure 13:
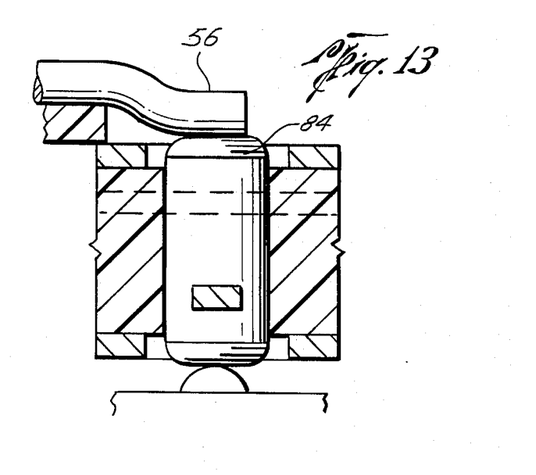

Another method, shown in FIG. 13, for interconnecting the conductors is to fill the vias with a conductive material 84 to which the trace 56 can be bonded. The via can be filled, for example, by sputtering, evaporation, or ion beam deposition. U.S. application Ser. No. 174,054, filed Mar. 28, 1988, the disclosure of which is herein incorporated by reference, discloses a technique for filling vias as herein discussed. The filled via provides for bottom and top trace or wire attachment.

Figure 14:
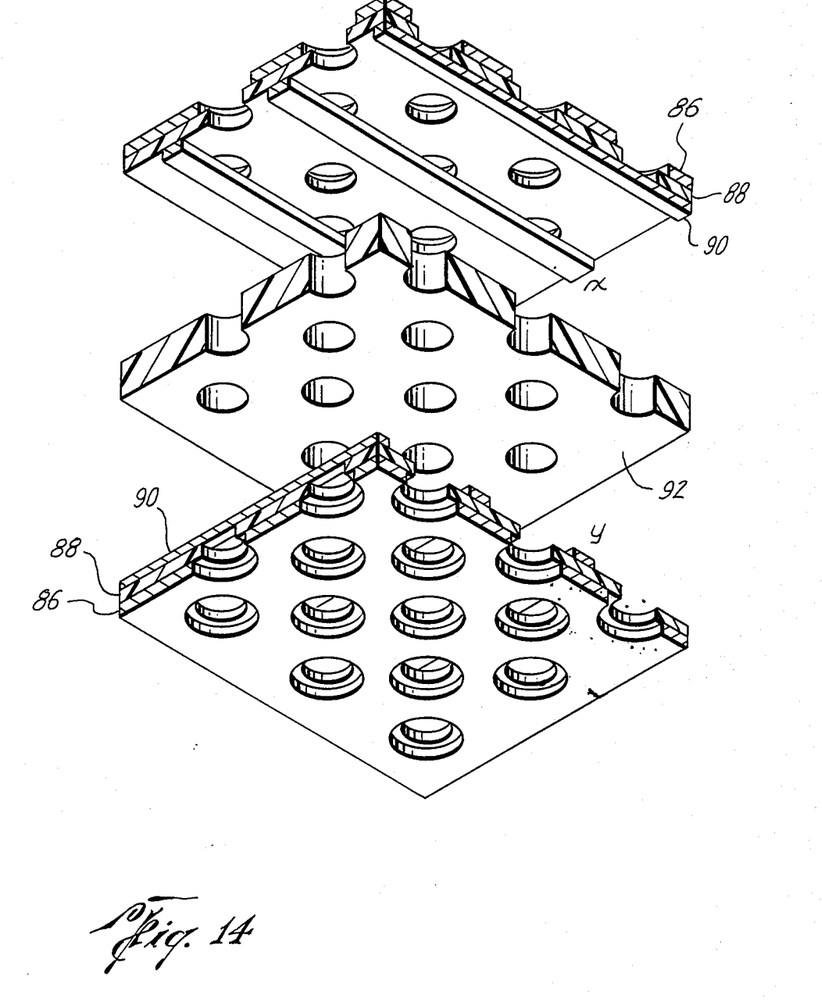
FIG. 14 is an exploded isometric bottom view of an interconnect structure according to the present invention.

The sandwich structure of the interconnect is shown in more detail in FIG. 14. As can be seen, the interconnect can be manufactured by producing symmetric wafers of ground plane 86—dielectric 88—conductor 90. The wafers are arranged so that the conductors are turned orthogonal to each other, as shown. A dielectric 92 is then positioned between the two wafers so as to align the vias. Though not shown, the dielectric 92 can have channels to accommodate the conductors 90.

The interconnect can be fabricated by a variety of known processes according to the feature size of the via and microstrip traces. For example, in a discrete component application, if a 50 mil grid is the requirement for a discretionary wiring scheme (implying 20 mil diameter vias and 10 mil wide traces with a dielectric thickness between each conductor layer of 5 mils if the design is scaled), an epoxy glass circuit board processing technique could be employed. In a multi-chip substrate application, the required via grid dimension might be 5 mils (or less) and the medium film substrate process on silicon can be employed. In the example shown (10 mil grid, 2 mil width traces, 1 mil polyimide, and 4 mil diameter vias), a flexible substrate fabrication process may be employed. An example of the latter is a fabrication process utilizing plating of photodefined metal layers and alternate coating of photodefined polymer layers starting with either a metal foil or polymer film. An alternative approach to the flexible substrate construction is to employ punched metal films and laminated dielectrics in an alternate layered construction.

In summary, the present invention is scaleable depending upon application. The fabrication process depends, accordingly, on the application of the substrate.

Via profiles can be made, for example, by etching polyimide with a $CO_2$ laser using the previously etched via pattern in the conductor plane as a mask. $CO_2$ radiation is absorbed by polyimide, reflected from copper.

The above production method is useful, for example, in the smaller scale, substrate technology. As a related point, because of the smaller sizes present in substrate technology, the H-shaped and U-shaped connectors discussed above may not be practical as a technique for joining the wire traces or jumpers to the underlying conductors.

Of course, as mentioned above, an advantage of the present invention is that it is scaleable. The envisioned scale depends on the application. For example, the invention is applicable in the TAB (tape automated bonding) tape or flexible circuit process using a polyimide/copper or similar multilayer composite construction. Appropriate dimensions are 2 mil circuit trace widths and 0.7 mil thickness (NEMA ½ ounce copper), 4 mil via diameters, and 10 mil face centered via arrays as described in FIG. 4. For a polyimide dielectric (dielectric constant approximately 3.5), layer thickness of 1 mil between trace and ground plane is appropriate; this configuration would yield a characteristic impedance of about 50 ohms. It is desirable to have a thicker dielectric layer between the orthogonal interior circuit traces to minimize the deviation from the ideal microstrip configuration and performance. 2 mils or more are appropriate for this dimension. If all copper layers are of the $\frac{1}{2}$ ounce thickness, the overall thickness of the construction should thus be at least 7 mils. This design is appropriate for interfacing components, such as ICs in pin or pad grid array packages with densities as tight as 50 mil centers. The user programming of the wiring would involve the chemical, electrochemical or mechanical means (etching, plating, laser machining or welding) discussed above. If the chip is in a 50 mil pad array package it would mount on the substrate at every 5th via (using the via filling/interconnect technique as discussed below). FIG. 9 is an example of this type of connection of chip package to substrate wiring net.

On a larger scale, one could fabricate this invention using standard printed circuit board technologies as in glass-epoxy (FR4 or FR5) materials. In this case an appropriate trace width would be 10-20 mils, via diameter would be 20-40 mils and trace spacing would be 50-100 mils. The dielectric thickness between layers (balanced against the dielectric constant and trace width and thickness to select the desired characteristics impedance) would be in the order of 5-10 mils and the overall thickness (assuming 1 ounce copper) would be 26 mils or more. These dimensions would be appropriate for the interconnection of ICs housed in conventional dual in-line packages (DIP) with leads on 100 (or 50 using the smaller dimensions) mil centers. The DIP is interconnected to the substrate by the via filling attachment means or by the designing of a mechanical contact or clip to attach to the individual package leads. At this scale mechanical means of programming the interconnects, such as mechanically punching out the undesired connections and pressure contact to the desired connections via devices such as 72 are feasible.

On a smaller scale, of the dimensions of thick or medium films, the trace widths could be 1 mils or thinner and of $\frac{1}{4}$ ounce copper or less. Trace spacing is 5 mils or less with a via diameter of 2 mils and the dielectric thickness scales to $\frac{1}{2}$ mil for a 50 ohm impedance. At this dimensional level it will be appropriate to attach IC chips directly to the substrate. One means of accomplishing this (for the less complex chip) would be to attach a wire (gold or aluminum) to the desired connection in the appropriate via by means of the epoxy, solder, or amalgam techniques outlined for the flexcircuit case, or by means of laser welding or soldering. This step is accomplished prior to or after bonding the other end of the wire to the connection pads of the chip. Another example involves the use of more complex chips which have previously had a TAB tape interconnect attached. The outer lead bond sites are attached to selected substrate via connection sites by the described method above. It is desirable to design the outer lead bond sites of the tape to connect directly with the grid pattern (or integral multiple thereof) for optimum connection capability. For example, if the medium film substrate is in the form of 5 mil face centered layout, the TAB tape outer lead bond sites should be on 5 or 10 mil centers for optimum utilization of the routing capability of the substrate.

Figure 15:
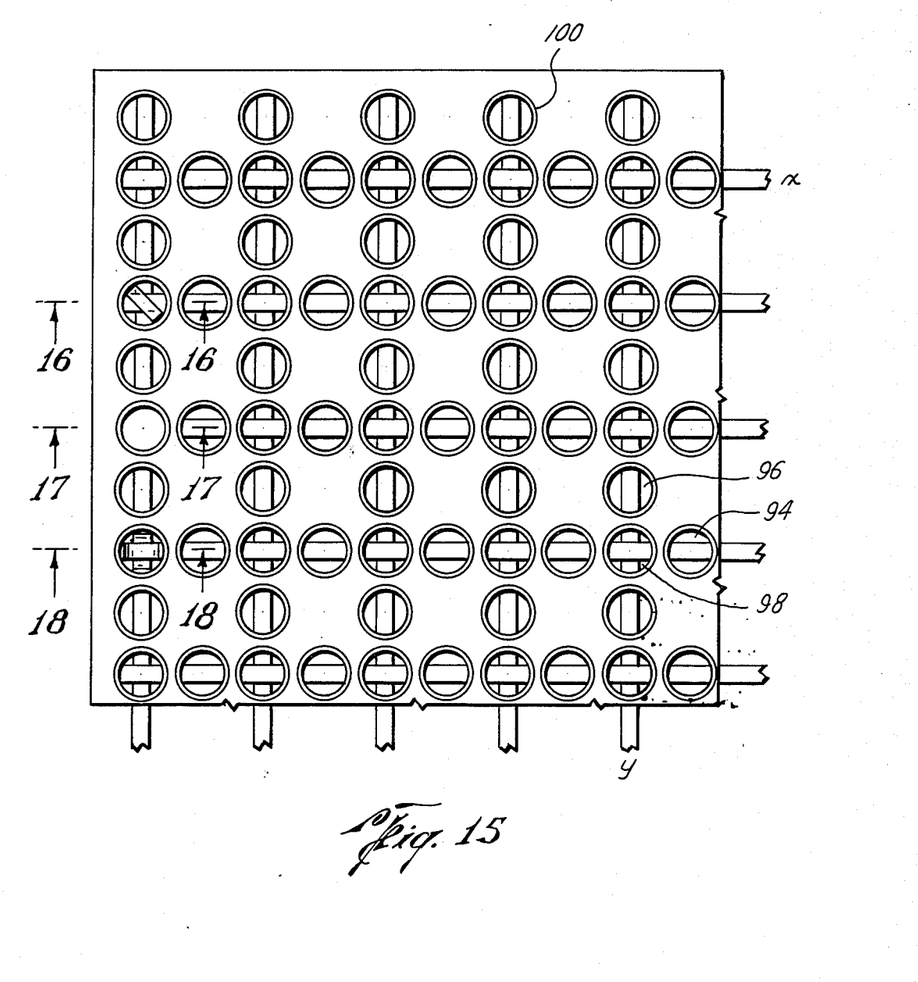
FIG. 15 is a plan view of another embodiment of an interconnect according to the present invention.

Another embodiment of the present interconnect structure is shown in FIG. 15. In addition to the vias providing access to the x- and y-wires, individually 94 and 96 respectively, there are provided vias 98 in the areas of x-y overlap. Accordingly, there are fifty percent more vias per unit substrate surface area compared to the embodiment of FIG. 4. The x-y interconnections, using the methods outlined in the preceding paragraphs, are made within these additional vias. With this arrangement, one possibility is to make x-y connections only at these additional vias 98. The x- and y-vias 94 and 96 can be used solely for conductor interruption. Accordingly, while the figure shows a lip 100 in the vias, the edges of the conductive plane may be flush with the via edges, since no interconnects are made over the conductive plane surface.

However, in the embodiment of FIG. 15, the required hole size may force substrate configurations to be fabricated with x- and y-arrays on 12 mils or greater centers, for the same trace width and dielectric thickness, thus causing a reduction in interconnect density. In addition, the shielding effect provided by the outer conductive planes is omitted where it is most necessary to reduce interaction between the orthogonal arrays—in the vicinity of the x-y crossovers. In critical applications, as described previously, the interaction between x- and y-wires in unused vias 98 can be substantially reduced by restoration of the outer conductive plane. This may be done by closing unused via openings by foil overlayment to maintain a more ideal microstrip environment.

Figure 16:
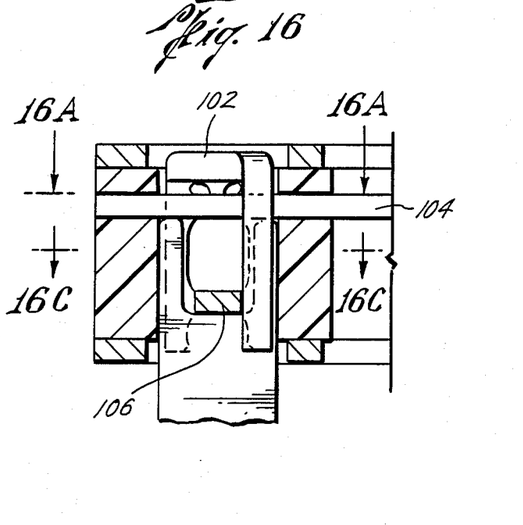
FIGS. 16–18 are cross-sectional views illustrating means for joining overlapping wires in the embodiment of FIG. 15.
Figure 16A:
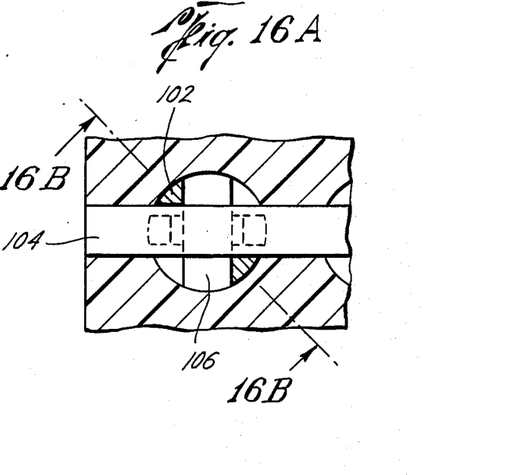
Figure 16B:
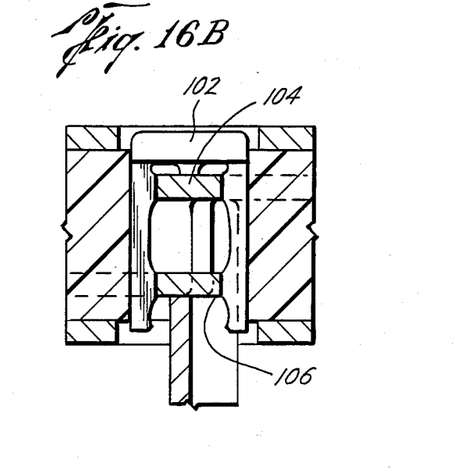
Figure 16C:
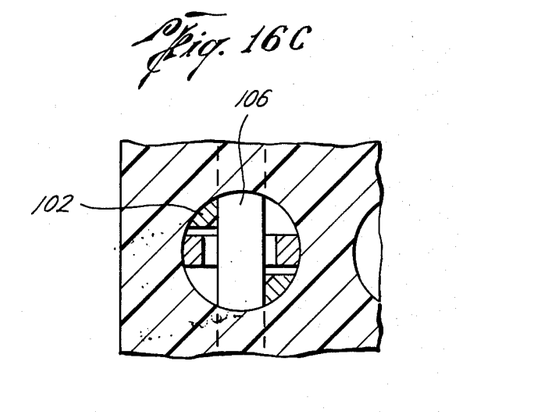
Figure 17:
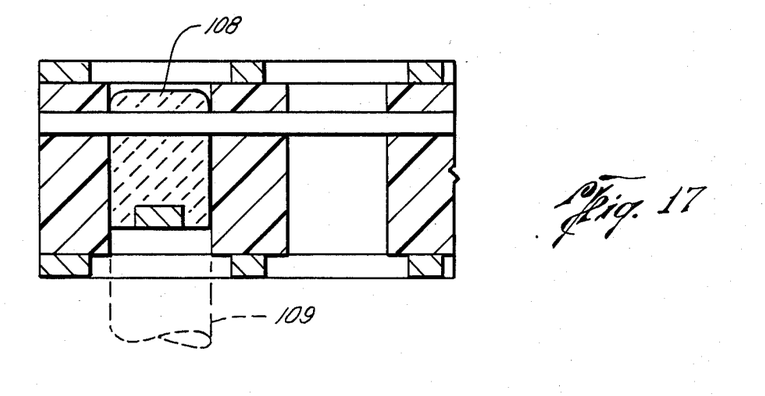
Figure 18:
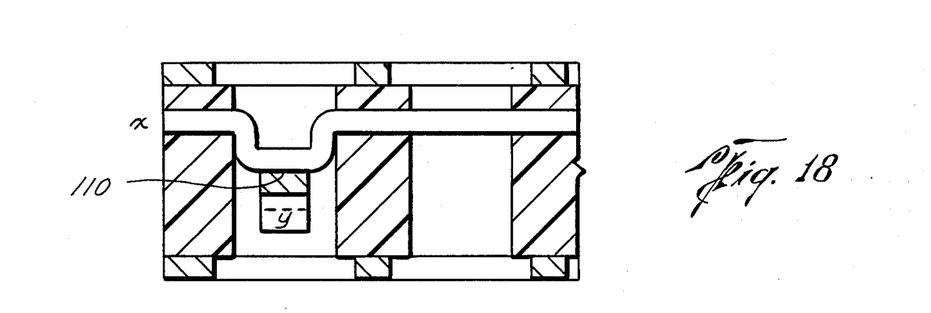

FIGS. 16-18 illustrate various means for interconnecting the x- and y-wires at vias 98. FIG. 16 illustrates a mechanical clip 102 which frictionally engages x-wire 104 and y-wire 106. As can be seen by reference to FIG. 15, the clip is placed diagonally across the x-wire. FIGS. 16A-C are cross-sectional views of the clip along various axes to more specifically illustrate the clip structure.

FIG. 16 illustrates the use of mechanical devices, similar to those used in insulation displacement connectors which are believed to involve the formation of gas-tight microwelds between the sliding interface surfaces, as the connection is made, due to the high pressures generated by the elastic deformation of the device. This use of a mechanically generated connection is only appropriate at the largest scale of the invention, for vias and traces of at least 10 and 20 mils size, respectively, in order for the interconnection device to be of reasonable size and durability.

FIG. 17 depicts a via filling technique. This technique can be used at any scale but is most appropriate for the smaller feature sizes (via size 10 mils or less). This process is analogous to plating-up or electroforming but is more conveniently accomplished by the end user by filling with an amalgam, epoxy or solder particle-in-flux solution (as in hybrid circuit technology) which can be dispensed manually (or in an automated process) from a pipet and subsequently cured (or reflowed). The curing or reflow step can be accomplished by heating the entire substrate or by the selective heating by an appropriate radiation source such as by a laser beam of the proper wavelength for energy absorption by the via fill material.

Finally, FIG. 18 depicts a direct x- to y-bond 110. In this embodiment, a bond between individual members of the x-y array can be accomplished as described immediately above.

A wide variety of materials and technology can be utilized to construct the discretionary interconnect of the present invention. A preferred technology is the copper/polyimide technology, such as used in the manufacture of beam lead tape or flexible circuitry.

In a preferred embodiment, the individual conductors are of about ½ ounce copper, about 2 mils in width, on about 10 mils centers, and spaced about 1 mils from the nearer conducting plane. The orthogonal conductor arrays are separated by about 1 to 3 mils of dielectric. The individual x- and y- conductors possess approximately 50 ohm characteristic impedance, with respect to outer conducting planes. The vias are formed on a faced-centered interdigited arrangement of about 10 mil center square arrays of about 6 mil diameter vias.

The present invention, therefore, is well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A discretionary interconnect, comprising:
    a first set of essentially parallel, co-planar electrically conductive wires;
    a second set of essentially parallel, co-planar electrically conductive wires, said first set of wires being orthogonal and non-planar to said second set of wires;
    a first conductive plane positioned on the side of said first set of wires opposite said second set of wires;
    a second conductive plane positioned on the side of said second set of wires opposite said first set of wires;
    a first set of vias having diameters equal to or less than about 20 mils and extending from the top surface of the interconnect to said first set of wires; and
    a second set of vias having diameters equal to or less than about 20 mils and extending from the top surface of the interconnect to said second set of wires.

2. A discretionary interconnect as claimed in claim 1, wherein said first and second sets of vias form a face-centered configuration.

3. A discretionary interconnect as claimed in claim 1, further comprising a third set of vias at the areas of overlap of said first and second set of wires.

4. A discretionary interconnect as claimed in claim 1, further comprising means for joining said wires.

5. A discretionary interconnect as claimed in claim 4, wherein said joining means includes a wire trace.

6. A discretionary interconnect as claimed in claim 5, wherein said wire trace includes an insulative layer on at least one side of said trace and extending along a majority of said trace.

7. A discretionary interconnect as claimed in claim 4, wherein said joining means comprises an H-shaped connector.

8. A discretionary interconnect as claimed in claim 4, wherein said joining means comprises a U-shaped connector.

9. A discretionary interconnect as claimed in claim 4, wherein said joining means comprises an insulated wire jumper.

10. A process for customizing an interconnect, comprising the steps of:
    constructing an interconnect which includes a first conductive plane, a first set of essentially parallel, co-planar conductive wires, a second set of essentially parallel, co-planar conductive wires on the side of said first set of conductive wires opposite said first conductive plane, a second conductive plane positioned on the side of said second set of wires opposite said first set of wires, a first set of vias accessing said first set of wires, and a second set of vias accessing said second set of wires, said vias having diameters equal to or less than about 20 mils and extending from the top surface of the interconnect to said first and second sets of wires, respectively;
    selectively removing sections of said wires at said vias; and
    selectively interconnecting said wires at said vias.

11. A process as claimed in claim 10, wherein said removal step is performed mechanically.

12. A process as claimed in claim 10, wherein said removal step is performed chemically.

* * * * *